United States Patent [19]

Hamada

[11] 4,054,843
[45] Oct. 18, 1977

[54] AMPLIFIER WITH MODULATED POWER SUPPLY VOLTAGE

[75] Inventor: Osamu Hamada, Tokyo, Japan

[73] Assignee: Sony Corporation, Tokyo, Japan

[21] Appl. No.: 676,926

[22] Filed: Apr. 14, 1976

[30] Foreign Application Priority Data

Apr. 17, 1975    Japan ................................ 50-46694

[51] Int. Cl.² .............................................. H03F 3/183
[52] U.S. Cl. ................................... 330/263; 330/276; 330/297
[58] Field of Search ............. 330/10, 13, 15, 22, 330/40

[56] References Cited

U.S. PATENT DOCUMENTS

| | | | |
|---|---|---|---|
| 3,426,290 | 2/1969 | Jensen | 330/40 |
| 3,486,128 | 12/1969 | Lohrmann | 330/40 |

FOREIGN PATENT DOCUMENTS

| | | | |
|---|---|---|---|
| 1,918,618 | 10/1970 | Germany | 330/40 |
| 1,167,917 | 4/1964 | Germany | 330/22 |

OTHER PUBLICATIONS

Younge, "Bootstrapping Bias Supply Increases IC Voltage Capacity," *Electronics*, vol. 41, No. 22, Oct. 28, 1968, pp. 90, 91, 330–332.

*Primary Examiner*—James B. Mullins
*Attorney, Agent, or Firm*—Lewis H. Eslinger; Alvin Sinnderbrand

[57] ABSTRACT

The power supply voltage of an amplifier is modulated by a signal having a waveform that corresponds, at least in selective parts, to the waveform of the signal being amplified by the amplifier.

10 Claims, 30 Drawing Figures

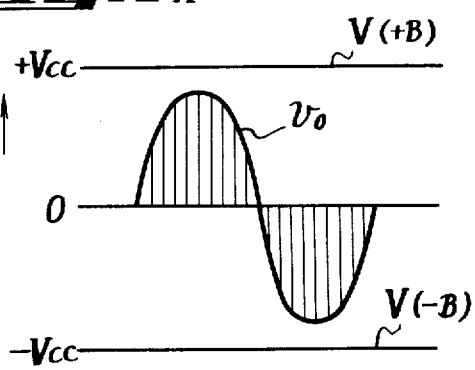
Fig. 2A
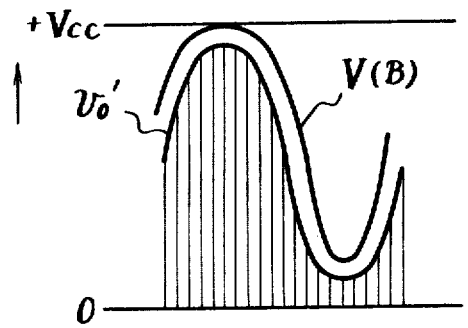
Fig. 10A
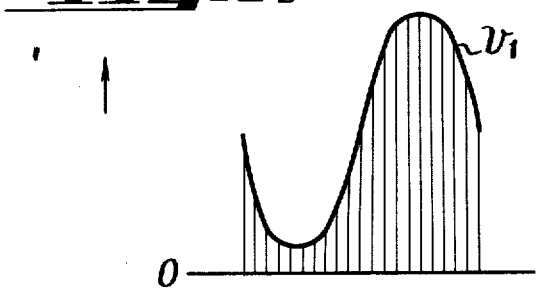
Fig. 2B
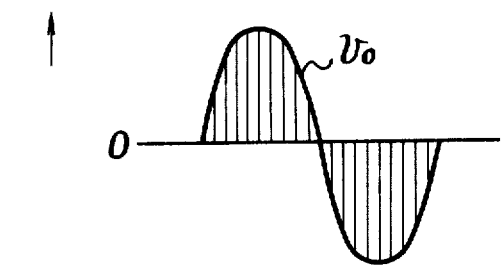
Fig. 10B
Fig. 2C
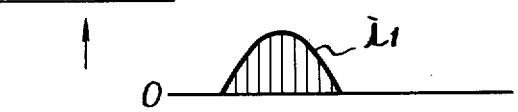
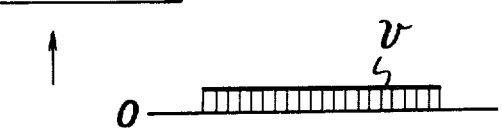
Fig. 10C
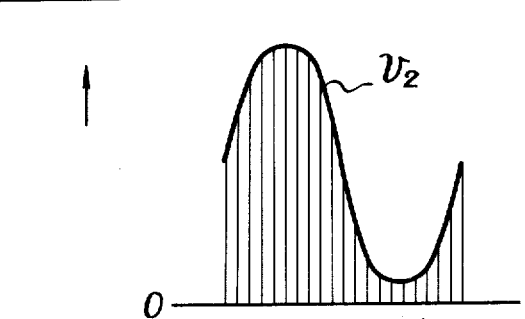
Fig. 2D
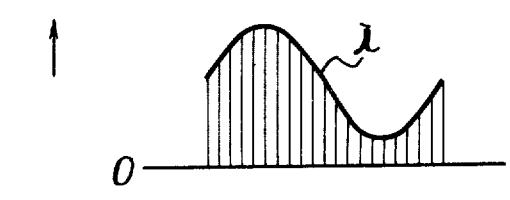
Fig. 10D
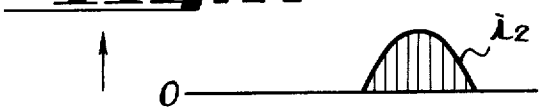
Fig. 2E

*Fig.*-5A
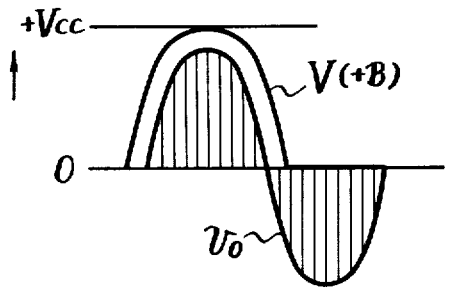
*Fig.*-5B
*Fig.*-5C
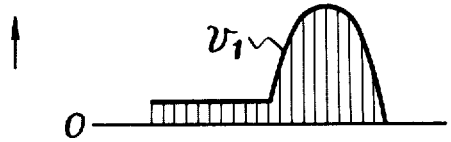
*Fig.*-5D
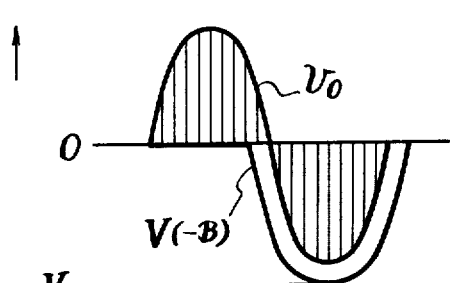
*Fig.*-5E
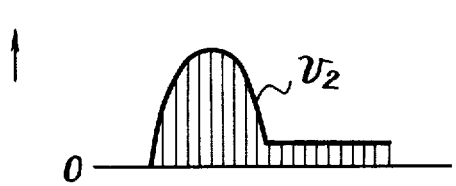
*Fig.*-5F
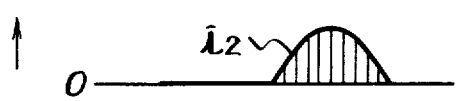
*Fig.*-8A
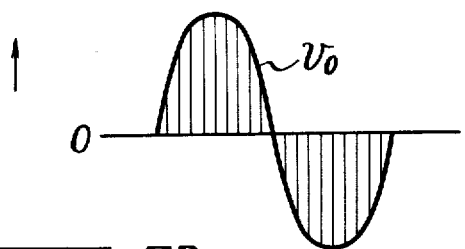
*Fig.*-8B
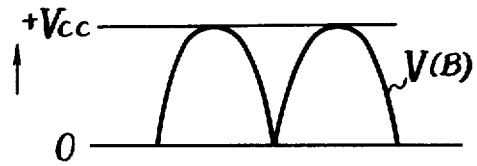
*Fig.*-8C
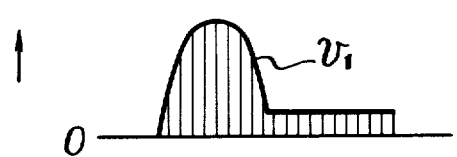
*Fig.*-8D
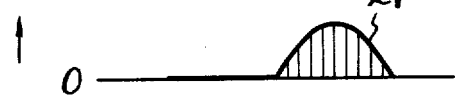
*Fig.*-8E
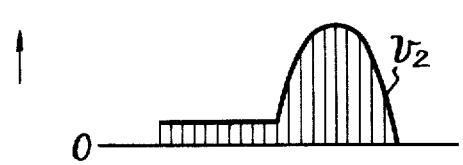
*Fig.*-8F

AMPLIFIER WITH MODULATED POWER SUPPLY VOLTAGE

BACKGROUND OF THE INVENTION

1. Field of the Invention

The present invention relates generally to an amplifier that has a power supply voltage source, the output voltage of which is modulated in accordance with the signal being amplified by the amplifier.

2. Description of the Prior Art

It is customary in amplifiers, particularly single-ended, push-pull amplifiers, to supply a fixed direct voltage. In the case of single-ended, push-pull amplifiers, the direct voltage power supply terminals may include a negative voltage terminal below the ground, or reference, voltage and a positive terminal above the reference voltage. The signal being amplified normally swings back and forth about the zero, or reference, point. As a result, in single-ended, push-pull amplifiers, current flows through the amplifying components, usually transistors of opposite conductivity type, when the voltage across the respective one of those transistors is high and that transistor is conductive. As a result, there is considerable loss of power and the efficiency of the amplifier circuit is relatively low.

SUMMARY AND OBJECTS OF THE INVENTION

It is an object of the present invention to provide an improved amplifier circuit of greater efficiency than prior art amplifier circuits by modulating the power supply voltage appropriately.

According to one aspect of the present invention, an amplifier circuit is provided that includes an input terminal to which an input signal is applied. The amplifier further includes an output terminal from which an output signal is obtained and a load is connected to the output terminal. The power supply circuit for the amplifier connecting the input terminal to the output terminal includes means for modulating the operating voltage supplied to the amplifier. The modulation is in accordance with the signal being amplified, and may be taken from the input terminal or the output terminal.

If the amplifier is a push-pull amplifier of the single-ended type having both a negative power supply terminal and a positive power supply terminal, the negative direct voltage from the power supply itself and the positive voltage from the power supply are both modulated according to the signal being amplified. Such modulation may be achieved by a transistor having its collector-emitter circuit connected in series between the respective source terminal of the power supply, i.e., the positive terminal and the negative terminal and the corresponding power supply voltage terminal of the single-ended, push-pull amplifier. The series connected transistors in the positive and negative sections of the power supply may be controlled by pulse width modulated signals to cause those transistors to conduct current having a value that corresponds to the instantaneous value of the amplified signal. The pulsating currents in both positive and negative sections are smoothed by suitable smoothing filters, and the output voltage of these filters is actually the direct voltage to operate the single-ended, push-pull amplifier.

The pulse width modulated signals to control the series connected transistors can be derived from comparator circuits that compare the signal being amplified, which may be obtained from across the load of the single-ended, push-pull amplifier, with a relatively high frequency sawtooth signal of the appropriate polarity such that for intervals when one section of the single-ended, push-pull amplifier is operative, the appropriate power supply voltage value will be supplied to it, and when the other polarity of the signal is to be amplified, the proper value of the power supply voltage will be supplied to the other section of the push-pull amplifier.

In the case of a normal push-pull amplifier the amplified signal may be passed through a fullwave rectifier to generate the proper waveform to modulate the single power supply voltage applied to the push-pull amplifier.

Even if the amplifier is a single-ended amplifier, its efficiency may still be improved by modulating the power supply voltage by the signal being amplified, for example, by obtaining the modulating signal from the output of the single-ended amplifier.

Further objects and advantages of the invention will become apparent from the following description taken in conjunction with the attached drawings.

BRIEF DESCRIPTION OF THE DRAWINGS

FIGS. 2A–2E are waveforms used for explaining the operation of the circuit in FIG. 1.

FIGS. 5A–5F are waveforms of signals that occur in the operation of the amplifier circuit in FIG. 3.

FIGS. 8A–8F are waveforms of signals that occur in the operation in the circuit in FIG. 7.

FIGS. 10A–10D are waveforms of signals that occur in the operation of the circuit in FIG. 9.

DESCRIPTION OF THE PREFERRED EMBODIMENTS

Figure 1:
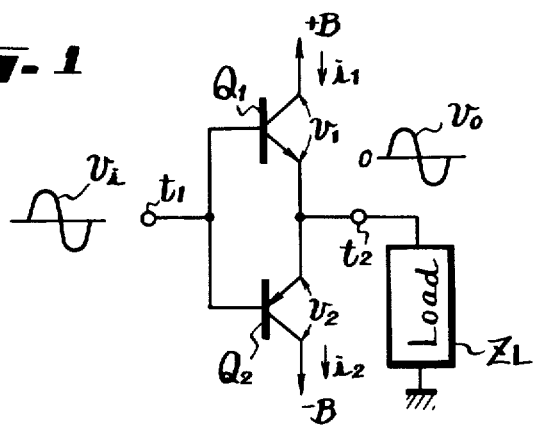
FIG. 1 is a schematic diagram of a standard single-ended, push-pull amplifier according to the prior art.

FIG. 1 shows a single-ended, push-pull amplifier that comprises an NPN transistor $Q_1$ and a PNP transistor $Q_2$. The emitters of the transistors are connected directly together and the collectors of the transistors are connected, respectively, to a positive power supply terminal $+B$ and a negative power supply terminal $-B$. The voltage at the positive power supply terminal is $+V_{CC}$, and the voltage at the negative power supply is $-V_{CC}$. The bases of the two transistors $Q_1$ and $Q_2$ are connected directly together to an input terminal $t_1$ to receive an input signal $v_i$. The emitters of the transistors are connected to an output terminal $t_2$ and a load $Z_L$ is connected between this output terminal and ground, which serves as a reference voltage point. An output voltage $v_o$ is applied across the load $Z_L$ and may be measured at the terminal $t_2$.

In the operation of the circuit in FIG. 1, the waveform of the output voltage $v_o$ is illustrated on FIG. 2A as having no DC component. The positive peak of the voltage $v_o$ is less than the voltage $+V_{CC}$, and the negative peak of the voltage $v_o$ has a magnitude less than the magnitude of the negative power supply voltage $-V_{CC}$. With power supply voltages of such magnitude, the collector-emitter paths of the transistors $Q_1$ and $Q_2$ are conductive.

As illustrated in FIG. 2B, the collector-emitter voltage across the transistor $Q_1$ is $v_1$. This voltage causes a current $i_1$, having a waveform shown in FIG. 2C, to flow through the collector-emitter circuit of the transistor $Q_1$. In a similar manner, there is a voltage $v_2$ shown in FIG. 2D across the emitter-collector circuit of the transistor $Q_2$, causing a current $i_2$, that has a waveform shown in FIG. 2E, to flow through this emitter-collector circuit. As a result, during positive half-cycles of the input signal voltage $v_i$ applied to the terminal $t_1$ in FIG. 1, the transistor $Q_1$ becomes conductive. During each negative half-cycle of the input voltage $v_i$ the transistor $Q_2$ becomes conductive so that the currents $i_1$ and $i_2$ flow through the transistors $Q_1$ and $Q_2$ alternatively. It is assumed that push-pull, single-ended amplifiers produce negligible distortion of the input signal $v_i$, and therefore the output signal $v_o$ at the terminal $t_2$ has the same waveform and is in phase with the signal $v_i$.

It is apparent from inspection of FIGS. 2A–2E that, when no current flows through either of the transistors $Q_1$ or $Q_2$, there is no dissipation of energy, even if the voltages across the transistors $Q_1$ and $Q_2$ are high. However, if a high voltage is applied across the emitter-collector circuit of transistor $Q_1$ or the collector-emitter circuit of transistor $Q_2$ when these transistors are conductive, there is a substantial power loss in the respective conductive transistor. As a result, the efficiency of the amplifier circuit becomes low.

Figure 6:
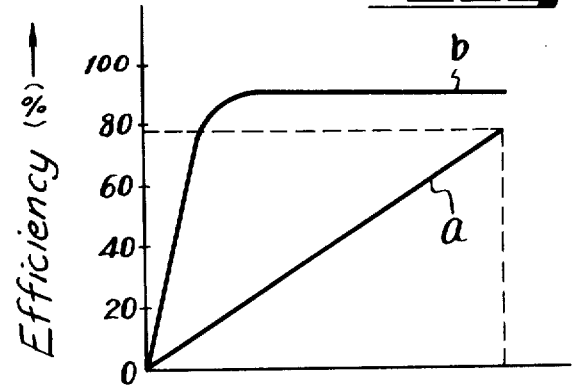
FIG. 6 is a graph showing the output voltage versus efficiency characteristics of the amplifier circuit of the present invention.

In general a single-ended, push-pull amplifier of the type shown in FIG. 1 is more efficient when operated as a class B amplifier than when operated as a class A amplifier. The theoretical value of efficiency of a class B amplifier in proportion to its output amplitude increases as the output amplitude itself increases and reaches a value of about 78% at the maximum output level $P_{o\,max}$. This is illustrated by the straight line $a$ in the graph in FIG. 6. However, such a percentage of efficiency is not sufficient.

Figure 3:
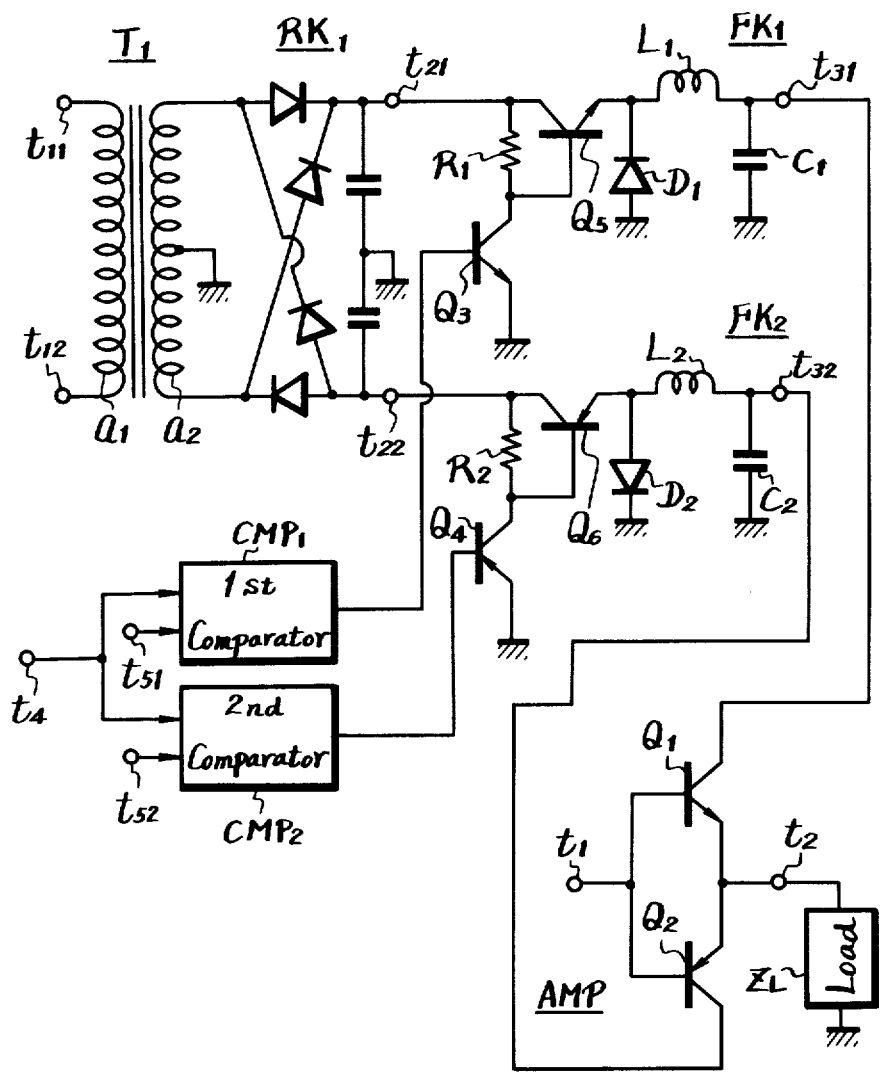
FIG. 3 is a schematic circuit diagram of one embodiment of an amplifier circuit according to the present invention.

FIG. 3 shows one embodiment of an amplifier circuit according to the present invention utilizing the same single-ended, push-pull amplifier circuit as shown in FIG. 1. This circuit is designated AMP in FIG. 3, and the components thereof are identified by the same reference characters as the corresponding components in FIG. 1.

In FIG. 3 a variable power source voltage generating circuit, generally indicated VPS, and which is basically a voltage modulating circuit, is employed for producing a power supply voltage varied in magnitude in accordance with the input signal applied to the input, or base, electrodes of the transistors $Q_1$ and $Q_2$. In view of the fact that the amplifier AMP produces negligible distortion, the power supply voltage may alternatively be modulated with the output voltage at the terminal $t_2$ connected to the single-ended, push-pull amplifier. The power source includes a transformer $T_1$ that has a primary winding $a_1$ with terminals $t_{11}$ and $t_{12}$ connected to a suitable commercial power source. The transformer $T_1$ also includes a secondary winding $a_2$ that has a grounded center tap. The ends of the secondary winding $a_2$ are connected to a rectifier $RK_1$ that may be considered as two full-wave rectifiers of opposite polarity. The positive rectified voltage is vailable at the output terminal $t_{21}$ while the negative power supply voltage is available at the output terminal $t_{22}$. Since the secondary winding $a_2$ has a grounded center tap, the positive and negative voltages as the terminals $t_{21}$ and $t_{22}$, respectively, are of equal magnitude and are both smoothed to some degree by filter capacitors between the respective output terminals and ground.

Two transistors $Q_5$ and $Q_6$ operate as variable impedance elements connected to the respective output terminals $t_{21}$ and $t_{22}$ of the rectifying circuit $RK_1$. The effect of varying the impedance of the transistors $Q_5$ and $Q_6$ is to vary the respective positive and negative output voltages of the power supply. In accordance with the fact that the voltage at the terminal $t_{21}$ is positive, the transistor $Q_5$ is an NPN transistor and has its collector connected to the terminal $t_{21}$. In a similar manner, the collector of the PNP transistor $Q_6$ is connected to the negative power supply terminal $t_{22}$. The effective collector-emitter impedance of the transistor $Q_5$ is controlled by an NPN transistor $Q_3$ that has a collector load resistor $R_1$ which is also connected between the collector and base of the transistor $Q_5$. The impedance of the transistor $Q_6$ is controlled by a PNP transistor $Q_4$ that has a collector load resistor $R_2$ that is also connected between the collector and base of the transistor $Q_6$. The emitters of the transistors $Q_3$ and $Q_4$ are connected to ground. The input voltage to the base of the transistor $Q_3$ is obtained from a first comparator $CMP_1$, while the base voltage for the transistor $Q_4$ is obtained from a similar second comparator $CMP_2$. These comparators have a common input terminal $t_4$ and separate second input terminals $t_{51}$ and $t_{52}$, respectively. The terminal $t_4$ is supplied with a voltage which has the same waveform as the input or output signal of the amplifier circuit AMP, and the terminals $t_{51}$ and $t_{52}$ are supplied with relatively high frequency (as compared to the signal $S_1$) sawtooth wave signals $S_2$ and $S'_2$ of opposite polarity. These pairs of signals operate in the respective comparators $CMP_1$ and $CMP_2$ to produce pulse width modulated signals to be applied to the bases of the transistors $Q_3$ and $Q_4$, respectively.

The emitter electrodes of the transistors $Q_5$ and $Q_6$ are grounded through diodes $D_1$ and $D_2$, respectively, and are connected to positive and negative output terminals $t_{31}$ and $t_{32}$ by filters $FK_1$ and $FK_2$, respectively. The filter $FK_1$ consists of a series inductor $L_1$ and a shunt capacitor $C_1$, while the filter $FK_2$ consists of a corresponding series inductor $L_2$ and shunt capacitor $C_2$.

Figure 4A:
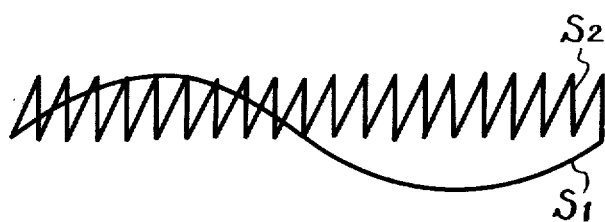
FIGS. 4A–4D are waveforms of signals that occur in the operation of comparators in the circuit in FIG. 3.
Figure 4B:
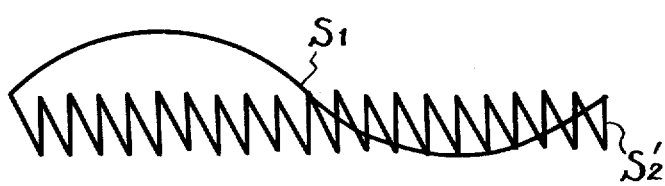
Figure 4C:
Figure 4D:

The operation of the circuit in FIG. 3 will be described with reference to the voltage waveforms shown in FIGS. 4A–4D and in FIGS. 5A–5F. It is assumed that the amplifier AMP is substantially free of distortion so that the signal waveform $S_1$ in FIG. 4A may be considered to be either the input or output signal of the amplifier circuit. It is the signal $S_1$ that is applied to the common input terminal $t_4$ of the comparators $CMP_1$ and $CMP_2$. The sawtooth voltage waveform applied to the terminal $t_{51}$ of the comparator $CMP_1$ is indicated by the waveform $S_2$ in FIG. 4A. A similar sawtooth wave of opposite polarity and indicated as the wave $S'_2$ and shown in FIG. 4B is applied to the terminal $t_{52}$ of the second comparator $CMP_2$. As a result, the comparators $CMP_1$ and $CMP_2$ produce, at their respective output terminals, pulse width modulated signals $S_3$ and $S_4$ in FIGS. 4C and 4D, respectively. These pulse width modulated signals $S_3$ and $S_4$ are applied in the proper polarities to the base electrodes of the transistors $Q_3$ and $Q_4$, respectively, to effect the necessary control of the transistors $Q_5$ and $Q_6$ to transmit current pulses of varying width therethrough. Because of the smoothing effects of the filters $FK_1$ and $FK_2$, the power source voltages at the output terminals $t_{31}$ and $t_{32}$ have the positive and negative values $V(+B)$ and $V(-B)$ with waveforms as shown in FIGS. 5A and 5D, respectively. These are the voltages that are applied to the collectors of the transistors $Q_1$ and $Q_2$ of the single-ended, push-pull amplifier AMP, and they are proportional to the input signal at the terminal $t_1$ during alternate half-cycles of the input signal. During the remaining half-cycles the voltages at the terminals $t_{31}$ and $t_{32}$ are zero.

The signal output voltage at the output terminal $t_2$ of the amplifier AMP is assumed to have the waveform $v_o$ as shown in FIGS. 5A and 5D. The maximum excursions of the voltage $v_o$ are between the maximum positive voltage $+V_{CC}$ and the maximum negative voltage $-V_{CC}$ of the power source voltages $V(+B)$ and $V(-B)$. The difference between the respective voltages $V(+B)$ and $V(-B)$ and the voltage $v_o$ is the voltage across the conductive collector-remitter circuit of the respective transistors $Q_1$ and $Q_2$ during their conductive half-cycles. Thus, the voltage across the collector-emitter circuit of the transistor $Q_1$ has the value $v_1$ shown in FIG. 5B and the voltage across the emitter-collector circuit of the transistor $Q_2$ has the value $v_2$ shown in FIG. 5E. As a result, collector currents $i_1$ and $i_2$ with waveforms shown in FIGS. 5C and 5F flow through the transistors $Q_1$ and $Q_2$, respectively. It shoud be noted that when the collector current $i_1$ flows through the transistor $Q_1$, the voltage $v_1$ across the collector-emitter circuit of the transistor has a constant, low value, as shown in FIG. 5B. Similarly, when the collector current $i_2$ flows through the transistor $Q_2$ the voltage $v_2$ across the emitter-collector circuit also has a constant low value, as shown in FIG. 5E. Accordingly, the power loss of the transistors $Q_1$ and $Q_2$ when they are conductive is much lower in the circuit in FIG. 3 than is the case of the transistors $Q_1$ and $Q_2$ in the prior art circuit shown in FIG. 1. This is shown in the graph in FIG. 6 by a curve $b$, from which it is apparent that the efficiency of the amplifier circuit of the invention shown in FIG. 3 is approximately constant at about 90% from a low output value to a high output.

Figure 7:
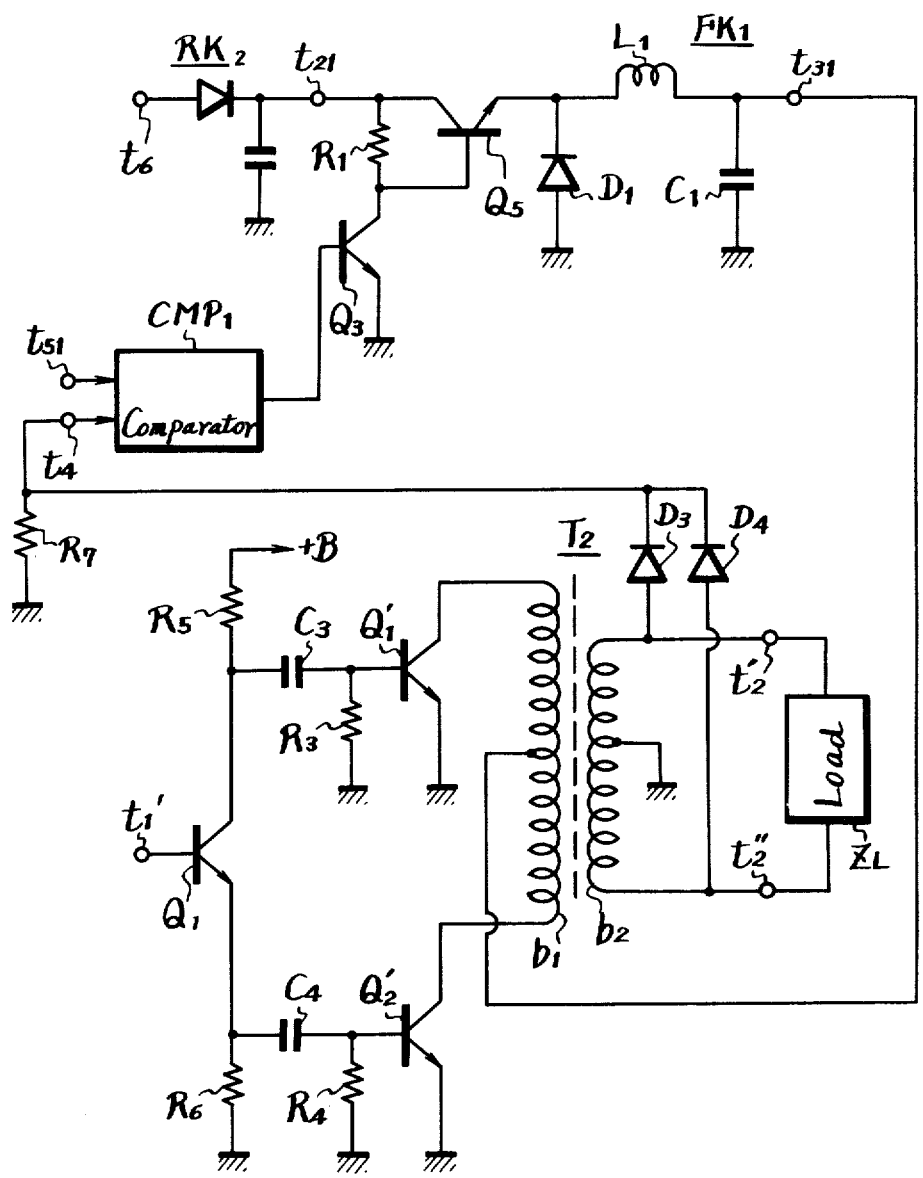
FIG. 7 is a schematic circuit diagram of another embodiment of the invention.

FIG. 7 shows a push-pull circuit that is not of the single-ended configuration but has two NPN transistors $Q'_1$ and $Q'_2$. A phase-splitter transistor $Q_7$ is connected to an input terminal $t'_1$ and has collector and emitter load resistors $R_5$ and $R_6$, respectively. The collector of the phase-splitter transistor $Q_7$ is connected by way of an RC coupling circuit consisting of a capacitor $C_3$ and a resistor $R_3$ to the base of the transistor $Q'_1$. The emitter of the phase-splitter transistor $Q_7$ is connected by a similar RC coupling circuit consisting of a capacitor $C_4$ and a resistor $R_4$ to the base of the transistor $Q'_2$. The collectors of the transistors $Q'_1$ and $Q'_2$ are connected to opposite ends of the primary winding $b_1$ of an output transformer $T_2$. This transformer has a center-tapped secondary winding $b_2$ with end terminals $t'_2$ and $t''_2$ connected across the load $Z_L$. The power supply that is to have its output voltage modulated in the circuit in FIG. 7 includes a rectifier $RK_2$, which in this case is a single diode connected to a power input terminal $t_6$. There is a smoothing capacitor across the output of the rectifier circuit $RK_2$. The output terminal $t_{21}$ of the rectifier circuit is connected to a circuit that is basically the same as the positive section of the power supply in the circuit in FIG. 3, and includes the series connected transistor $Q_5$ with the diode $D_1$ connected between the emitter of the transistor and ground. The filter circuit $FK_1$ consisting of the series inductor $L_1$ and shunt capacitor $C_1$ is connected between the emitter of the transistor $Q_5$ and the power supply output terminal $t_{31}$.

The transistor $Q_5$ is controlled by the transistor $Q_3$ that has a collector load resistor $R_1$ connected to the power supply terminal $t_{21}$ and across the collector and base electrodes of the transistor $Q_5$. The output of a comparator circuit $CMP_1$ is connected to the base of the transistor $Q_3$, and this comparator has two input terminals $t_4$ and $5_{51}$. The two ends of the secondary winding $b_2$ of the transformer $T_2$ are connected by way of a pair of diodes $D_3$ and $D_4$ to the ungrounded end of a resistor $R_7$ at the terminal $t_4$ of the comparator $CMP_1$.

The operation of the circuit in FIG. 7 will be described with reference to the waveforms in FIGS. 8A-8F. FIG. 8A shows the waveform of the input voltage applied to the terminal $t'_1$ and, in the absence of distortion, the output voltage across the load $Z_L$. FIG. 8B shows the waveform of the power supply voltage $V(B)$ obtained at the output terminal $t_{31}$ of the power supply. This voltage has the waveform of a full-wave rectified signal voltage $v_o$ due to the fact that the output voltage across the center-tapped secondary winding $b_2$ of the transformer $T_2$ is passed through a full-wave rectifier $D_3$ and $D_4$ to the input terminal $t_4$ of the comparator $CMP_1$. The push-pull amplifier transistors $Q'_1$ and $Q'_2$ are made conductive and non-conductive alternately in accordance with the input signal applied to the input terminal $t'_1$, and the collector-emitter voltages of the transistors $Q'_1$ and $Q'_2$ have the waveforms $v_1$ and $v_2$ shown in FIGS. 8C and 8E, respectively. Since both of the transistors $Q'_1$ and $Q'_2$ are of the same polarity type, they require the same polarity of voltage to be supplied to them to make them conductive, but because of the push-pull connection, they are conductive alternately. When the respective transistors $Q'_1$ and $Q'_2$ are conductive, so that the currents $i_1$ and $i_2$ (FIGS. 8A and 8F) flow therethrough, the voltages $v_1$ and $v_2$ are constant and are equal to the low voltage across the collector-emitter circuits of the respective transistors $Q'_1$ and $Q'_2$. Therefore, the transistors $Q'_1$ and $Q'_2$ consume less power and operate at greater efficiency than they would if supplied with a fixed power supply voltage in accordance with the prior art.

Figure 9:
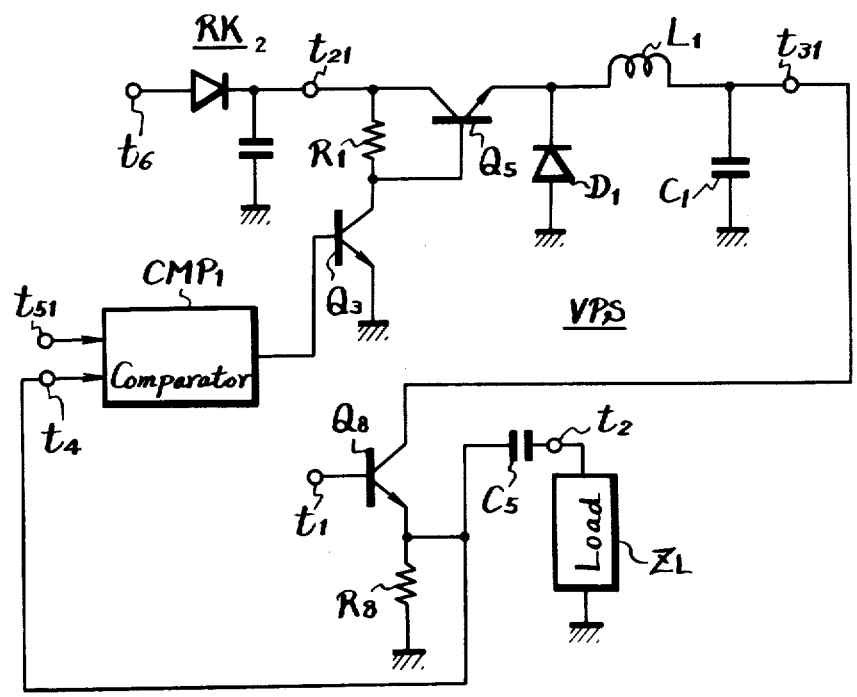
FIG. 9 is a schematic circuit diagram of another embodiment of the invention.

FIG. 9 shows a single-ended amplifier connected to obtain the advantage of a modulated power supply voltage in accordance with the present invention. The amplifier in FIG. 9 includes a transistor $Q_8$ operated as a class A emitter-follower amplifier. The transistor $Q_8$ has an input terminal $t_1$ connected to its base and an emitter resistor $R_8$. The emitter is connected through a capacitor $C_5$ to the output terminal $t_2$ and the load $Z_L$ is connected between the terminal $t_2$ and ground.

The power supply in FIG. 9 is quite similar to that in FIG. 7. There is a direct, rather than a rectifier, connection from the emitter of the transistor $Q_8$ to the input terminal $t_4$ of the comparator $CMP_1$. The previously mentioned sawtooth wave signal is connected to a second input terminal $t_{51}$ of the comparator $CMP_1$. The pulse width modulated signal obtained at the output of the comparator is connected to the base of the control transistor $Q_3$. The remainder of the power supply circuit is the same as in FIG. 7 and need not be described again.

The operation of the circuit in FIG. 9 will be described with the reference to FIGS. 10A–10D. FIG.

10A shows the waveform of the output voltage $v'_o$ obtained at the emitter electrode of the transistor $Q_8$. The modulated waveform of the source voltage V(B) corresponds to the waveform of the voltage $v'_o$ and is higher than the latter by the amount of the voltage drop across the collector-emitter circuit of the amplifier transistor $Q_8$. The peak value of the voltage V(B) is the original power supply voltage $+V_{CC}$.

FIG. 10B shows the waveform of the output voltage $v_o$ after its direct voltage component has been eliminated by the capacitor $C_5$. The voltage $v_o$ in FIG. 10B is the voltage between the output terminal $t_2$ and ground. The source voltage V(B) shown in FIG. 10A and applied to the collector of the transistor $Q_8$ is modulated, or varied, in response to the output voltage $v'_o$, so that a voltage $v$ of low, constant amplitude, as shown in FIG. 10C, is present across the collector-emitter circuit of the transistor $Q_8$. Thus, even though a current $i$ having a waveform as shown in FIG. 10D passes through the collector-emitter circuit of the transistor $Q_8$, the power consumption of this transistor is reduced with respect to that of the standard class A, single-ended amplifier, and its efficiency is increased by virtue of the low voltage across the collector-emitter circuit.

With the amplifier circuits of the invention as described, since the power supply source voltage, which is changed in accordance with the input signal applied to the input electrode of the amplifier is applied through the load of the amplifier across the output electrode and common electrode thereof, the voltage applied across the output electrode and common eletrode of the amplifier is relatively low, and therefore the power consumption of the amplifier is relatively low. Amplitude modulation of the power supply voltage in accordance with the input signal or output signal of the amplifier prevents an excess voltage from being applied to the amplifier, so that efficiency of the amplifier is improved. This efficiency is further improved in the case of a push-pull amplifier.

In the examples of the invention as shown in the drawings, a bipolar transistor is used as the amplifying element or elements, but it is also possible to use field effect transistors, vacuum tubes, or the like as the amplifying elements.

In addition, the present invention can be utilized in various types of amplifier circuits such as class A, class B, class AB, or single-ended and push-pull types. In push-pull amplifiers, it is possible to use transistor amplifying elements of the same conductivity type or of complementary conductivity types.

It will be apparent that many modifications and variations can be effected in the embodiments shown without departing from the true scope of the invention as defined by the following claims.

What is claimed is:

1. In an amplifier having signal input means supplied with an input signal to be amplified, signal output means connected with a load, amplifying means connected between said signal input means and said signal output means for supplying an output signal to the latter, and power supply means for supplying an operating voltage to said amplifying means; a circuit for modulating said operating voltage supplied to the amplifying means in accordance with one of said input and output signals comprising direct voltage source means, a first transistor having base, emitter and collector electrodes, smoothing means connected in series with the collector-emitter circuit of said first transistor between said direct voltage source means and said amplifying means, a first resistor connected between the base and collector electrodes of said first transistor, a second transistor having base, emitter and collector electrodes, the collector-emitter circuit of said second transistor being connected between the base electrode of said first transistor and a reference voltage point, an amplitude comparator, and means for applying to said comparator a sawtooth wave signal and a signal varying with said one of the input and output signals so that said comparator provides a pulse width modulated signal having a duty factor varying with said one signal and which is applied to said base electrode of said second transistor.

2. An amplifier according to claim 1, in which said amplifying means comprises a further transistor having base, emitter and collector electrodes, the collector-emitter circuit of said further transistor being connected in series with said load between said smoothing means and the reference voltage point, the base electrode of said further transistor being connected to said signal input means and said load being connected to said comparator to supply the output voltage across said load to said comparator for comparison with said sawtooth wave signal.

3. An amplifier according to claim 2, further comprising means to bias said further transistor to operate in the class A mode.

4. An amplifier according to claim 1, in which said direct voltage source means has positive and negative voltage terminals, said amplifying means is of the push-pull type and has first and second operating voltage supply terminals, and said smoothing means and said collector-emitter circuit of the first transistor are connected in series between said positive voltage terminal and said first operating voltage supply terminal; and said circuit for modulating the operating voltage supplied to the amplifying means further includes a third transistor having base, emitter and collector electrodes, second smoothing means connected in series with the collector-emitter circuit of said third transistor between said negative voltage terminal and said second operating voltage supply terminal, a second resistor connected between the base and collector electrodes of said third transistor, a fourth transistor having base, emitter and collector electrodes, the collector-emitter circuit of said fourth transistor being connected between the base electrode of said third transistor and said reference voltage point, a second amplitude comparator, and means for applying to said second comparator a second sawtooth wave signal of opposite polarity to the first mentioned sawtooth wave signal and said signal varying with said one of the input and output signals so that said second comparator provides a second pulse width modulated signal having a duty factor also varying with said one signal and which is applied to said base electrode of said fourth transistor, with said second pulse width modulated signal and the first mentioned pulse width modulated signal occurring alternatively.

5. An amplifier according to claim 4, in which the first mentioned smoothing means and said second smoothing means are constituted by first and second low pass filters, respectively, and first and second diodes are connected between said reference voltage point and connection points of the emitter electrode of said first transistor with said first low pass filter and of the emitter electrode of said third transistor with said second low pass filter, respectively, with the polarities of said first and second diodes being the same as the base-emitter junctions of said first and third transistors, respectively.

6. An amplifier according to claim 4, in which said push-pull amplifying means includes a pair of additional transistors connected in complementary push-pull relationship.

7. An amplifier according to claim 6, in which said pair of additional transistors each have base, emitter and collector electrodes, the collector electrodes of said additional transistors are respectively connected to said first and second operating voltage supply terminals, the emitter electrodes of said additional transistors are connected to each other and to said output terminal means, the load is connected in series between said output terminal means and said reference voltage point, and said base electrodes of the additional transistors are connected with said input terminal so as to be supplied with the input signal with the same polarity.

8. An amplifier according to claim 1, in which said amplifying means is of the push-pull type and includes third and fourth transistors of the same conductivity type each having base, emitter and collector electrodes, and said signal input means includes phase splitting means receiving said input signal and applying input signals of opposite polarity to the base electrodes of said third and fourth transistors.

9. An amplifier according to claim 8, in which said signal output means comprises a signal output transformer having primary and secondary windings, the primary winding being center tapped and the ends thereof being connected to the collector electrodes of said third and fourth transistors, the center tap of said primary winding being supplied with the output of said smoothing means, and said secondary winding being connected across the load.

10. An amplifier according to claim 9, in which said means for supplying to said comparator a signal varying with one of said input and output signals includes a full wave rectifier connected across said load and to said comparator for supplying to the latter a full wave rectified signal of the voltage across the load.

* * * * *